United States Patent
Ikemi et al.

(10) Patent No.: US 9,406,866 B2
(45) Date of Patent: Aug. 2, 2016

(54) PIEZOELECTRIC DEVICE WITH PIEZOELECTRIC CERAMIC LAYER HAVING AG SEGREGATED IN VOIDS IN SINTERED BODY OF PEROVSKITE COMPOSITION

(71) Applicant: TAIYO YUDEN CO., LTD., Taito-ku, Tokyo (JP)

(72) Inventors: Shinichiro Ikemi, Takasaki (JP); Yutaka Doshida, Takasaki (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 51 days.

(21) Appl. No.: 14/360,275

(22) PCT Filed: Nov. 27, 2012

(86) PCT No.: PCT/JP2012/080545
§ 371 (c)(1),
(2) Date: May 22, 2014

(87) PCT Pub. No.: WO2013/094368
PCT Pub. Date: Jun. 27, 2013

(65) Prior Publication Data
US 2014/0368090 A1    Dec. 18, 2014

(30) Foreign Application Priority Data

Dec. 20, 2011 (JP) ................. 2011-278228

(51) Int. Cl.
*H01L 41/187* (2006.01)
*C04B 35/493* (2006.01)
(Continued)

(52) U.S. Cl.
CPC .......... *H01L 41/1876* (2013.01); *C04B 35/491* (2013.01); *C04B 35/493* (2013.01);
(Continued)

(58) Field of Classification Search
CPC ...................................................... C04B 35/00
USPC ........ 310/358; 501/134; 252/62.9 R, 62.9 PZ
See application file for complete search history.

(56) References Cited

U.S. PATENT DOCUMENTS

| 5,079,197 A | 1/1992 | Ushida et al. |
| 5,721,464 A * | 2/1998 | Dibbern ............... H01L 41/083 310/358 |

(Continued)

FOREIGN PATENT DOCUMENTS

| CN | 1051106 A | 5/1991 |
| EP | 0423822 B1 | 1/1993 |

(Continued)

OTHER PUBLICATIONS

An Office Action issued by the State Intellectual Property Office of China, mailed Dec. 29, 2014, with a search report (Dec. 18, 2014) for Chinese counterpart application No. 201280057788.9.

(Continued)

*Primary Examiner* — J. San Martin
(74) *Attorney, Agent, or Firm* — Law Office of Katsuhiro Arai

(57) ABSTRACT

A piezoelectric device is provided with: a piezoelectric ceramic layer that is obtained by firing a piezoelectric ceramic composition which contains a perovskite composition and an Ag component; and a conductor layer that sandwiches the piezoelectric ceramic layer, wherein Ag is segregated in voids in a sintered body of the perovskite composition in the piezoelectric ceramic layer. The piezoelectric ceramic composition preferably contains a perovskite composition which is represented by $(Pba.Rex)\{Zr_b.Ti_c.(Ni_{1/3}Nb_{2/3})_d.(Zn_{1/3}Nb_{2/3})_e\}O_3$ (wherein Re represents La and/or Nd, and a-e and x satisfy the following conditions $0.95 \le a \le 1.05$, $0 \le x \le 0.05$, $0.35 \le b < 0.45$, $0.35 \le c \le 0.45$, $0 \le d \le 0.10$, $0.07 \le e \le 0.20$ and $b+c+d+e=1$) and 0.05-0.3% by mass of an Ag component in terms of oxides relative to the perovskite composition.

8 Claims, 1 Drawing Sheet

(51) Int. Cl.
  *C04B 35/626* (2006.01)
  *H01L 41/43* (2013.01)
  *H01L 41/047* (2006.01)
  *C04B 35/495* (2006.01)
  *C04B 35/491* (2006.01)

(52) U.S. Cl.
  CPC ......... *C04B35/495* (2013.01); *C04B 35/62685* (2013.01); *H01L 41/0477* (2013.01); *H01L 41/1873* (2013.01); *H01L 41/1875* (2013.01); *H01L 41/43* (2013.01); *C04B 2235/3203* (2013.01); *C04B 2235/3224* (2013.01); *C04B 2235/3227* (2013.01); *C04B 2235/3251* (2013.01); *C04B 2235/3279* (2013.01); *C04B 2235/3284* (2013.01); *C04B 2235/3291* (2013.01); *C04B 2235/768* (2013.01); *C04B 2235/786* (2013.01); *C04B 2235/85* (2013.01)

(56) References Cited

U.S. PATENT DOCUMENTS

| | | | |
|---|---|---|---|
| 8,669,694 B2 * | 3/2014 | Sato | H01L 41/083 252/62.9 PZ |
| 2006/0066176 A1 | 3/2006 | Nanataki et al. | |
| 2006/0202170 A1 | 9/2006 | Koizumi et al. | |
| 2007/0080317 A1 | 4/2007 | Iezumi et al. | |
| 2007/0197370 A1 * | 8/2007 | Nakamura | C04B 35/493 501/134 |
| 2007/0222341 A1 | 9/2007 | Iezumi et al. | |
| 2008/0018207 A1 * | 1/2008 | Nanataki | C04B 35/493 310/358 |
| 2008/0095927 A1 | 4/2008 | Nanataki et al. | |
| 2008/0129155 A1 | 6/2008 | Iezumi et al. | |
| 2010/0019624 A1 * | 1/2010 | Kaigawa | C04B 35/495 310/358 |
| 2010/0225710 A1 * | 9/2010 | Iwashita | B41J 2/14233 347/71 |
| 2012/0161588 A1 | 6/2012 | Hatano et al. | |

FOREIGN PATENT DOCUMENTS

| | | |
|---|---|---|
| JP | H03-215359 A | 9/1991 |
| JP | 2003238248 A | 8/2003 |
| JP | 2007-238374 A | 9/2007 |
| JP | 2008-050206 A | 3/2008 |
| JP | 4202657 B2 | 12/2008 |
| WO | 2006/035723 A1 | 4/2006 |
| WO | 2010128647 A1 | 11/2010 |

OTHER PUBLICATIONS

Second Notification of Reason for Refusal with Search Report issued on Aug. 19, 2015 by the State Intellectual Property Office of China for Chinese counterpart application No. 201280057788.9.

International Preliminary Report on Patentability (PCT/IB/373) issued Jun. 24, 2014, with Written Opinion (Translation) of the International Searching Authority (PCT/ISA/237), for corresponding international application PCT/JP2012/080545.

International Search Report (ISR) mailed Jan. 15, 2013, issued for International Application No. PCT/JP2012/080545.

A Notification of Reasons for Refusal issued by the Japanese Patent Office, mailed Apr. 5, 2016, for Japanese counterpart application No. 2013-550192.

* cited by examiner

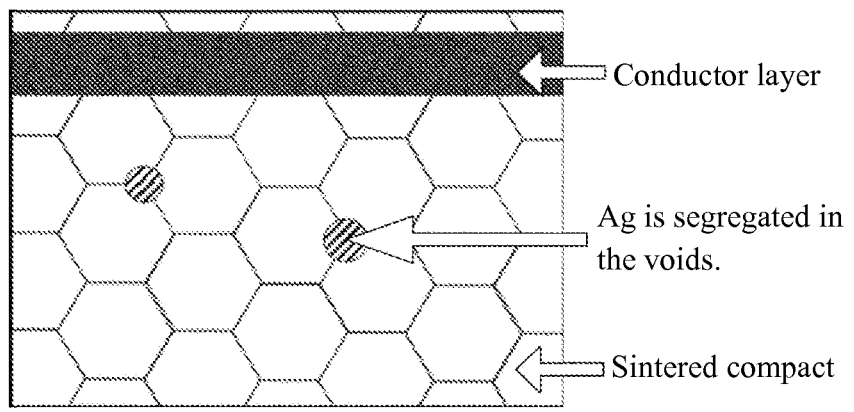

PIEZOELECTRIC DEVICE WITH PIEZOELECTRIC CERAMIC LAYER HAVING AG SEGREGATED IN VOIDS IN SINTERED BODY OF PEROVSKITE COMPOSITION

This application is the U.S. National Phase under 35 U.S.C. §371 of International Application PCT/JP2012/080545, filed Nov. 27, 2012, which claims priority to Japanese Patent Application No. 2011-278228, filed Dec. 20, 2011. The International Application was published under PCT Article 21(2) in a language other than English.

TECHNICAL FIELD

The present invention relates to a piezoelectric device such as an acoustic element, piezoelectric actuator, etc., particularly suitable for use in a high-temperature environment, as well as a piezoelectric ceramic composition used for such piezoelectric device.

BACKGROUND ART

Piezoelectric ceramic compositions are used as electromechanical conversion materials for piezoelectric devices such as acoustic elements, piezoelectric actuators, etc.

For example, Patent Literature 1 discloses a ferroelectric ceramic constituted by a perovskite solid solution expressed by $Pb_{1-(3/2)a}M_a\{(Ni_{1/3}Nb_{2/3})_{1-b}(Zn_{1/3}Nb_{2/3})_b\}_xTi_yZr_zO_3$ [where M is at least one type of element selected from a group that includes La and Nd, and x+y+z=1, a=0.005 to 0.03, b=0.5 to 0.95, x=0.1 to 0.4, y=0.3 to 0.5 and z=0.2 to 0.5] and containing 0.3 to 1.0 percent by weight of $MnO_2$.

Piezoelectric devices are adopting laminated structures in recent years for the purpose of performance improvement, lowering of driving voltage, and so on.

However, the ferroelectric ceramic in Patent Literature 1 involves a high sintering temperature of 1130 to 1300° C. and therefore requires a lot of thermal energy for sintering. In addition, an Ag alloy with high Pt or Pd content must be used as the material for internal electrodes to be sintered simultaneously with the ferroelectric ceramic, which presents a problem of adding to the cost of the piezoelectric device.

In light of the above, piezoelectric ceramic compositions that can be sintered at low temperature have been developed to lower the costs of piezoelectric devices.

Patent Literature 2 discloses a piezoelectric ceramic composition constituted by a perovskite composition expressed by $Pb_a\{Zr_b\cdot Ti_c\cdot(Ni_{1/3}Nb_{2/3})_d\cdot(Zn_{1/3}Nb_{2/3})_e\}O_3$ [where b+c+d+e=1, 1.000≤a≤1.020, 0.26≤b≤0.31, 0.34≤c≤0.40, 0.10≤d≤0.35 and 0.07≤e≤0.14] and also by $Ag_2O$ contained in the perovskite composition, wherein this $Ag_2O$ is contained by a ratio of 0.005 to 0.03 percent by weight, and it is claimed that this piezoelectric ceramic composition can be sintered at 900° C. or so.

PRIOR ART LITERATURES

Patent Literatures

Patent Literature 1: Japanese Patent Laid-open No. Hei 3-215359
Patent Literature 2: Japanese Patent No. 4202657

SUMMARY OF THE INVENTION

Problems to be Solved by the Invention

However, piezoelectric devices using the piezoelectric ceramic composition in Patent Literature 2 have a high coercive electric field and thus are difficult to apply for use at high temperature. Their high dielectric constant ∈ also presents a problem in that these piezoelectric devices have increased levels of power consumption.

Accordingly, the object of the present invention is to provide a piezoelectric device and piezoelectric ceramic composition suitable for use in a high-temperature environment.

Means for Solving the Problems

To achieve the aforementioned object, the piezoelectric device proposed by the present invention is a piezoelectric device having a piezoelectric ceramic layer obtained by sintering a piezoelectric ceramic composition that contains a perovskite composition and Ag component, as well as a conductor layer sandwiching the piezoelectric ceramic layer; wherein such piezoelectric device is characterized in that the piezoelectric ceramic layer has Ag segregated in the voids present in the sintered compact of the perovskite composition.

Preferably the perovskite composition contains a zirconate-titanate type perovskite composition and/or alkali-containing niobate type perovskite composition.

Preferably the piezoelectric device proposed by the present invention is such that the grain size of the Ag segregated in the voids present in the sintered compact of the perovskite composition is 0.1 to 3 μm in d80 diameter.

The piezoelectric ceramic composition of the piezoelectric device proposed by the present invention contains a zirconate-titanate type perovskite composition expressed by Formula (1) below, as well as an Ag component; wherein, preferably the Ag component is contained by 0.05 to 0.3 parts by mass per 100 parts by mass of the zirconate-titanate type perovskite composition in terms of oxides:

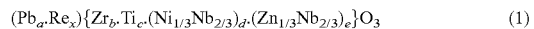

In the formula, Re represents La and/or Nd, and a to e and x meet the respective requirements below:

$$0.95 \leq a \leq 1.05$$

$$0 \leq x \leq 0.05$$

$$0.35 \leq b \leq 0.45$$

$$0.35 \leq c \leq 0.45$$

$$0 < d \leq 0.10$$

$$0.07 \leq e \leq 0.20$$

$$b+c+d+e=1$$

The perovskite composition of the piezoelectric device proposed by the present invention is an alkali-containing niobate type perovskite composition expressed by Formula (2) below;

wherein, preferably the piezoelectric ceramic layer has a Si and K-containing crystalline or non-crystalline substance present at the grain boundaries or grain boundary triple points of crystal grains constituted by a sintered compact of the perovskite composition:

In the formula, l to o meet the respective requirements below:

$$0.04 < l \leq 0.1$$

$$0 \leq m \leq 1$$

$$0.95 \leq n \leq 1.05$$

$$0 \leq o \leq 1$$

The piezoelectric device proposed by the present invention is such that, preferably the conductor layer is formed by Ag, Pd, Pt, Ni, Cu, or any alloy containing at least one of the foregoing.

Additionally, the piezoelectric ceramic composition proposed by the present invention is characterized in that it contains a zirconate-titanate type perovskite composition expressed by Formula (1) below, as well as an Ag component; wherein the Ag component is contained by a ratio of 0.05 to 0.3 parts by mass per 100 parts by mass of the zirconate-titanate type perovskite composition in terms of oxides:

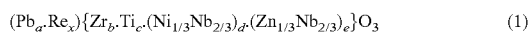
(1)

In the formula, Re represents La and/or Nd, and a to e and x meet the respective requirements below:

$$0.95 \leq a \leq 1.05$$

$$0 \leq x \leq 0.05$$

$$0.35 \leq b \leq 0.45$$

$$0.35 \leq c \leq 0.45$$

$$0 < d \leq 0.10$$

$$0.07 \leq e \leq 0.20$$

$$b+c+d+e=1$$

The piezoelectric ceramic composition proposed by the present invention is such that, preferably the maximum grain size of the Ag component is 3 μm or less.

Effects of the Invention

According to the piezoelectric device proposed by the present invention, where the piezoelectric ceramic composition contains a perovskite composition and Ag component, the sintering temperature of the piezoelectric ceramic composition is low and therefore Ag or any Ag alloy with high Ag content can be used for the conductor layer. Also because the piezoelectric ceramic layer has Ag segregated in the voids present in the sintered compact of the perovskite composition, the coercive electric field increases and the resulting piezoelectric device becomes suitable for use in a high-temperature environment. Furthermore, even when Ag or any Ag alloy is used for the conductor layer, Ag in the conductor layer will diffuse to the piezoelectric ceramic layer to prevent conductor layer deficiency, which in turn suppresses lowering of characteristics.

Moreover, the resulting piezoelectric device will have good piezoelectric characteristics so long as the grain size of Ag segregated in the voids present in the sintered compact of the perovskite composition is 0.1 to 3 μm in d80 diameter.

In addition, the piezoelectric ceramic composition containing a zirconate-titanate type perovskite composition expressed by Formula (1) above, as well as an Ag component, wherein the Ag component is contained by 0.05 to 0.3 parts by mass per 100 parts by mass of the perovskite composition in terms of oxides, forms a piezoelectric ceramic layer of high Curie temperature Tc, high coercive electric field, and low dielectric constant ∈ and can be sintered at low temperatures of 900° C. and below, and thus allows Ag or any Ag alloy with low Ag content to be used as the conductor metal material. As a result, a piezoelectric device of low power consumption suitable for use in a high-temperature environment can be manufactured at low cost.

In addition, the piezoelectric ceramic layer characterized by a Si and K-containing crystalline or non-crystalline substance present at the grain boundaries or grain boundary triple points of crystal grains constituted by a sintered compact of the alkali-containing niobate type perovskite composition expressed by Formula (2) above, provides a piezoelectric device of low power consumption suitable for use in a high-temperature environment.

BRIEF DESCRIPTION OF THE DRAWINGS

FIG. 1 A schematic section view of the piezoelectric device proposed by the present invention.

MODE FOR CARRYING OUT THE PRESENT INVENTION

As shown in FIG. 1, the piezoelectric device proposed by the present invention has a piezoelectric ceramic layer where Ag is segregated in the voids present in the sintered compact of the perovskite composition, as well as a conductor layer sandwiching the piezoelectric ceramic layer.

Segregating Ag in the voids present in the sintered compact of the perovskite composition makes Ag an oxygen supply source during sintering, which in turn has the effect of lowering the liquid-phase generation temperature. This way, the oxygen and Pb defect of the base body is suppressed and the material's thermodynamic stability increases, and as a result, the coercive electric field increases and the resulting piezoelectric device becomes suitable for use in a high-temperature environment. Furthermore, segregating Ag in the voids present in the sintered compact of the perovskite composition allows Ag in the conductor layer to diffuse to the piezoelectric ceramic layer, even when Ag or any Ag alloy is used for the conductor layer, and consequently conductor layer deficiency is prevented and property degradation can be suppressed.

Whether or not Ag is segregated in the voids present in the sintered compact of the perovskite composition can be observed using a TEM (transmission electron microscope) or SEM (scanning electron microscope), and the segregated Ag can be quantified by measuring its size distribution. In addition, whether the segregated Ag is metal Ag, not an oxide, can be checked by means of composition analysis based on characteristic X-rays.

Under the present invention, the piezoelectric ceramic layer is such that, preferably the grain size of the Ag segregated in the voids present in the sintered compact of the perovskite composition is 0.1 to 3 μm in d80 diameter. The resulting piezoelectric device will have good piezoelectric characteristics so long as the grain size of segregated Ag is within the aforementioned range. If the d80 diameter exceeds 3 μm at a given point, that point tends to become an origin of lower breakdown voltage and, because the number of Ag grains between the piezoelectric ceramic layers decreases, the pressure resistance longevity traits tend to drop. If the d80 diameter is less than 0.1 μm, on the other hand, Ag becomes uniformly diffused in the sintered compact and consequently the piezoelectric characteristics, etc., tend to deteriorate.

Under the present invention, segregated Ag was observed using a TEM image. The grain size of Ag was obtained by measuring the grain sizes of 200 Ag grains randomly selected on a TEM image by means of binarization and measurement of the lengths of parts determined as Ag, and then using the results to obtain the cumulative volume diameter and then the d80 diameter.

For the piezoelectric ceramic composition used to form the piezoelectric ceramic layer, one containing a perovskite composition and Ag component is used.

Preferably the perovskite composition is a zirconate-titanate type perovskite composition and/or alkali-containing niobate type perovskite composition.

For the zirconate-titanate type perovskite composition, one based on the compositional structure expressed by Formula (1) below is used preferably:

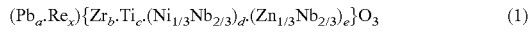

$$(Pb_a \cdot Re_x)\{Zr_b \cdot Ti_c \cdot (Ni_{1/3}Nb_{2/3})_d \cdot (Zn_{1/3}Nb_{2/3})_e\}O_3 \quad (1)$$

In Formula (1), Re represents La and/or Nd.

In Formula (1), a is qualified by $0.95 \le a \le 1.05$, where $1.00 \le a \le 1.02$ is preferred. If $a < 0.95$, excellent piezoelectric characteristics will still be obtained, but low-temperature sintering becomes impossible even when Ag is added; whereas, $a > 1.05$ will cause the secondary Pb phase deposits en masse and the piezoelectric characteristics will drop to a non-practical level. By adjusting a within the aforementioned range, a piezoelectric ceramic composition of small ceramic grain size can be obtained that exhibits good piezoelectric characteristics based on sintering at 900° C.

In Formula (1), x is qualified by $0 \le x \le 0.05$, where $0.003 \le x \le 0.007$ is preferred. In other words, the perovskite composition in Formula (1) may have its Pb partially substituted by La and/or Nd. Partially substituting Pb by La and/or Nd increases the piezoelectric constant. The Curie temperature Tc drops if $x > 0.05$. By adjusting x within the aforementioned range, the piezoelectric constant can be raised while keeping a high Curie temperature Tc of 300° C. or above.

Furthermore, adjusting a+x to the range of $1.00 \le a+x \le 1.02$ is preferred. That is because, with the perovskite of Formula (1), the characteristics can also be maintained by adjusting the A/B ratio of an ABO$_3$ type perovskite within a range of 1.00 to 1.02.

In Formula (1), b is qualified by $0.35 \le b \le 0.45$, where $0.38 \le b \le 0.42$ is preferred. The Curie temperature Tc drops if $b < 0.35$, whereas the piezoelectric constant drops if $b > 0.45$. By adjusting b within the aforementioned range, the piezoelectric constant can be raised while keeping a high Curie temperature Tc of 300° C. or above.

In Formula (1), c is qualified by $0.35 \le c \le 0.45$, where $0.38 \le c \le 0.42$ is preferred. The Curie temperature Tc drops if $c < 0.35$, whereas the piezoelectric constant drops if $c > 0.45$. By adjusting c within the aforementioned range, the piezoelectric constant can be raised while keeping a high Curie temperature Tc of 300° C. or above.

In Formula (1), d is qualified by $0 < d \le 0.10$, where $0.3 \le d \le 0.7$ is preferred. The Curie temperature Tc remains high but the piezoelectric constant drops if $d = 0$, whereas the Curie temperature Tc drops if $d > 0.10$. By adjusting d within the aforementioned range, the piezoelectric constant can be raised while keeping a high Curie temperature Tc of 300° C. or above.

In Formula (1), e is qualified by $0.07 \le e \le 0.20$, where $0.13 \le e \le 0.17$ is preferred. If $e < 0.07$, the base body undergoes significant grain growth and can no longer maintain a fine structure, thus making low-temperature sintering impossible; whereas, if $e > 0.20$, the piezoelectric constant drops. By adjusting e within the aforementioned range, the feasibility of low-temperature sintering, and the piezoelectric constant, can be maintained.

In Formula (1), b+c+d+e=1.

For the alkali-containing niobate type perovskite composition, one based on the compositional structure expressed by Formula (2) below is used preferably. A piezoelectric device having a piezoelectric ceramic layer in which a Si and K-containing crystalline or non-crystalline substance is present at the grain boundaries or grain boundary triple points of crystal grains constituted by a sintered compact of an alkali-containing niobate type perovskite composition expressed by Formula (2), has low power consumption and is suitable for use in a high-temperature environment:

$$(Li_l Na_m K_{1-l-m})_n (Nb_{1-o} Ta_o) O_3 \quad (2)$$

In Formula (2), preferably l is in the range of $0.04 < l \le 0.1$. If $l \le 0.04$ or $l > 0.1$, the piezoelectric constant at room temperature tends to drop.

In Formula (2), preferably m is in the range of $0 \le m \le 1$. If $m > 1$, a secondary phase is formed and the piezoelectric constant tends to drop.

In Formula (2), preferably n is in the range of $0.95 \le n \le 1.05$. If $n < 0.95$ or $n > 1.05$, a secondary phase is formed and the piezoelectric constant tends to drop.

In Formula (2), preferably o is in the range of $0 \le o \le 1$. If $o > 1$, a secondary phase is formed and the piezoelectric constant tends to drop.

For the piezoelectric ceramic composition under the present invention, one containing a zirconate-titanate type perovskite composition expressed by Formula (1), as well as an Ag component corresponding to 0.05 to 0.3 parts by mass per 100 parts by mass of the zirconate-titanate perovskite composition in terms of oxides, is used. This piezoelectric ceramic composition can be sintered at low temperatures of 900° C. and below, and allows for manufacturing of a piezoelectric device by using Ag or any Ag alloy with high Ag content as the conductor layer material. In addition, the piezoelectric ceramic layer obtained by sintering this piezoelectric ceramic composition has a high Curie temperature Tc of 300° C. or above, high coercive electric field of 0.8 kV/mm or more even at 120° C., and low dielectric constant $\in$ in a range of 1800 to 2200, and therefore the resulting piezoelectric device has low power consumption and becomes more suitable for use in a high-temperature environment. It should be noted that, under the present invention, the Curie temperature Tc, coercive electric field, and dielectric constant $\in$ represent values measured according to the methods described later in "Examples."

Examples of the Ag component contained in the piezoelectric ceramic composition include an oxide of Ag (Ag$_2$O) and carbonate of Ag (Ag$_2$CO$_3$), among others.

Preferably the maximum grain size of the Ag component is 3 μm or less. When the maximum grain size of the Ag component is 3 μm or less, Ag segregates easily in the voids present in the sintered compact of the perovskite composition. If it exceeds 3 μm, on the other hand, the Ag component deposits on the surface of the sintered compact and forms a secondary phase of Ag component, potentially causing the product longevity traits of the piezoelectric device to drop. There is no limit to how the maximum grain size of the Ag component is adjusted to 3 μm or less, and a method involving sifting of powder or method based on filtering of slurry can be used, for example.

Under the present invention, the grain size of the Ag component was measured using a TEM, with the largest of 200 randomly selected grains taken as the maximum grain size.

The Ag component is contained preferably by 0.05 to 0.3 parts by mass, or more preferably by 0.07 to 0.15 parts by mass, per 100 parts by mass of the perovskite composition in terms of oxides. If the Ag component is contained by less than 0.05 parts by mass, the tendency is that sintering at low temperatures becomes difficult, the bulk density (true density of the sintered compact) at 900° C. becomes low, and the moisture resistance characteristics deteriorate; whereas, if the Ag component is contained by more than 0.3 parts by mass, the Ag component may deposit on the surface of the sintered compact and form a secondary phase of Ag component, thereby causing the product longevity traits of the piezoelectric device to drop. So long as the Ag component is contained by an amount within the aforementioned range, a piezoelectric ceramic layer in which Ag is segregated in the voids present in the sintered compact of the perovskite composition can be formed with ease.

Under the present invention, the piezoelectric ceramic composition can also contain a Mn component. When a Mn component is contained, the obtained piezoelectric ceramic layer is hardened, the Q value increases, and the power consumption of the piezoelectric device can be reduced further.

Preferably the Mn component is contained by 0 to 1 percent by mass per 100 parts by mass of the perovskite composition in terms of oxides. Also under the present invention, the piezoelectric ceramic composition can also contain a Co component. When a Co component is contained, the piezoelectric characteristics and dielectric characteristics can be finely adjusted to desired characteristics. Preferably the Co component is contained by 0 to 1 percent by mass per 100 parts by mass of the perovskite composition in terms of oxides.

Under the present invention, preferably the grain size of the sintered compact of the perovskite composition is 3 μm or less. This way, the pressure resistance longevity traits can be improved.

The piezoelectric ceramic composition containing a zirconate-titanate type perovskite composition expressed by Formula (1) is obtained by mixing oxides, carbonates, etc., of Pb, La, Zr, Ti, Ni, Nb, and/or Zn to the stoichiometric ratios of a zirconate-titanate type perovskite composition expressed by Formula (1) and then agitating the mixture in water or other wet environment, followed by drying and sintering for 2 to 4 hours at 820 to 850° C. in atmosphere. This way, the metal components undergo solid solution reaction against one another to form a zirconate-titanate type perovskite composition expressed by Formula (1) above. The formed perovskite composition is wet or dry-crushed and then an Ag component is added, preferably by 0.05 to 0.3 parts by mass per 100 parts by mass of the perovskite composition, after which the mixture is dried. The Ag component can be added together with other materials when the perovskite composition is formed, but preferably it is added after the perovskite composition has been formed. By adding the Ag component after the perovskite composition has been formed, Ag segregates more easily in the voids present in the sintered compact of the perovskite composition.

Also, the piezoelectric ceramic composition containing an alkali-containing niobate type perovskite composition expressed by Formula (2) is obtained by mixing oxides, carbonates, etc., of Li, Na, K, Nb, and/or Ta to the stoichiometric ratios of an alkali-containing niobate type perovskite composition expressed by Formula (2) and then sintering in the same manner described above, so that the metal components undergo solid solution reaction against one another to form an alkali-containing niobate type perovskite composition expressed by Formula (2) above. The formed perovskite composition is wet or dry-crushed and then an Ag component is added, preferably by 0.05 to 0.3 parts by mass per 100 parts by mass of the perovskite composition, after which the mixture is dried.

With the piezoelectric device proposed by the present invention, the material to constitute the conductor layer is not limited in any way. A low-resistance material is preferred, and Ag, Pd, Pt, Ni, Cu, or any alloy containing at least one of the foregoing is more preferred. For the alloy, an Ag—Pd alloy or Ag—Pt alloy is preferred.

The piezoelectric device proposed by the present invention has low power consumption and is suitable for use in a high-temperature environment, and for example, it can be used particularly favorably in applications such as onboard speakers and other acoustic elements, piezoelectric actuators, and supersonic motors.

The aforementioned piezoelectric device can be manufactured, for example, using the method described below.

Binder, solvent, plasticizer, etc., are added to a piezoelectric ceramic composition containing a perovskite composition and Ag component to prepare a slurry, which is then formed to a thin film using the doctor blade method, etc., to manufacture a green sheet. Examples of binder include polyvinyl butyral resin and methacrylate resin, among others. Examples of plasticizer include dibutyl phthalate and dioctyl phthalate, among others. Examples of solvent include toluene and methyl ethyl ketone, among others.

Next, a conductor paste containing Ag, Ag—Pd alloy, Ag—Pt alloy, or other conductor metal is printed onto the obtained green sheet using the screen printing method, etc., to form an unsintered internal conductor layer of a specified pattern.

Next, multiple green sheets, each having an unsintered internal conductor layer formed on it, are stacked on top of one another and then pressure-bonded to manufacture an unsintered laminate.

Next, the unsintered laminate is put through a binder removal process, and then cut to a specified shape so that the unsintered internal conductor layer is exposed at the ends of the unsintered laminate. Thereafter, the end faces of the unsintered laminate are printed with a conductor paste containing a conductor metal, using the screen printing method or other method, to form unsintered external electrode layers.

Next, the unsintered laminate on which unsintered base metal has been formed is sintered for 2 to 3 hours at 850 to 900° C. in an oxygen ambience. This way, the aforementioned piezoelectric device proposed by the present invention, where piezoelectric ceramic layers are sandwiched by conductor layers, can be manufactured.

EXAMPLES

PbO, $La_2O_3$, $ZrO_2$, $TiO_2$, NiO, ZnO, $Nb_2O_5$ and $Ag_2O$ were prepared as material powders and the material powders were sifted to adjust their maximum grain size to 3 μm or less, respectively. Thereafter, the sifted material powders of perovskite composition were weighed to each set of ratios shown in Table 1 and put in a pot mill together with zirconia beads and ion exchange water and then wet-mixed for 15 hours, after which the obtained suspension liquid was transferred to a vat that was then put in a dryer and dried at 150° C.

TABLE 1

Piezoelectric ceramic composition

| | * Constituents of perovskite composition | | | | | | Amount of Ag$_2$O added (part by mass) |
|---|---|---|---|---|---|---|---|
| | a | x | b | c | d | e | |
| Sample 1A | 1.00 | 0.005 (Re=La) | 0.40 | 0.40 | 0.05 | 0.15 | 0.10 |
| Sample 1B | 1.00 | 0.005 (Re=Nd) | 0.40 | 0.40 | 0.05 | 0.15 | 0.10 |
| Sample 2 | 1.00 | 0 | 0.26 | 0.40 | 0.26 | 0.08 | 0.01 |
| Sample 3 | 1.00 | 0.005 (Re=La) | 0.40 | 0.40 | 0.05 | 0.15 | 0.00 |
| Sample 4 | 1.00 | 0.005 (Re=La) | 0.40 | 0.40 | 0.05 | 0.15 | 0.40 |
| Sample 5 | 1.06 | 0 | 0.40 | 0.40 | 0.05 | 0.15 | 0.10 |
| Sample 6 | 0.94 | 0 | 0.40 | 0.40 | 0.05 | 0.15 | 0.10 |
| Sample 7 | 1.00 | 0.6 (Re=La) | 0.40 | 0.40 | 0.05 | 0.15 | 0.10 |
| Sample 8 | 1.00 | 0 | 0.50 | 0.38 | 0.05 | 0.07 | 0.10 |
| Sample 9 | 1.00 | 0 | 0.38 | 0.50 | 0.05 | 0.07 | 0.10 |
| Sample 10 | 1.00 | 0 | 0.37 | 0.37 | 0.15 | 0.13 | 0.10 |
| Sample 11 | 1.00 | 0 | 0.40 | 0.40 | 0 | 0.20 | 0.10 |
| Sample 12 | 1.00 | 0 | 0.37 | 0.37 | 0.05 | 0.26 | 0.10 |
| Sample 13 | 1.00 | 0 | 0.45 | 0.45 | 0.07 | 0.03 | 0.10 |

* $(Pb_a \cdot Re_x)\{Zr_b \cdot Ti_c \cdot (Ni_{1/3}Nb_{2/3})_d \cdot (Zn_{1/3}Nb_{2/3})_e\}O_3$ Next, the dried mixture was sintered for 2 hours at 850° C. in atmosphere using an electric furnace. The metal oxides in the mixture underwent solid solution reaction against one another during sintering and a perovskite composition was formed.

Next, this perovskite composition and Ag$_2$O that had been weighed to each ratio shown in Table 1 were put in a pot mill together with zirconia beads and ion exchange water and then wet-crushed for 15 hours, after which the obtained suspension liquid was transferred to a vat that was then put in a dryer and dried at 150° C., to obtain a piezoelectric ceramic composition.

Next, each piezoelectric ceramic composition was mixed with a small amount of polyvinyl butyral and the mixture was compression-molded with a press machine at a pressure of 1.5 MPa, to obtain a disc-shaped sample of 8 mm in diameter and 0.5 mm in thickness.

Next, this sample was put in an electric furnace and sintered for 2 hours at 900 to 1050° C. in atmosphere, after which the sample was taken out of the electric furnace and printed with a fritless Ag paste on both sides, and then baked at 700° C. in atmosphere so as to use the baked paste as external electrodes.

This disc-shaped sample with external electrodes installed on it was measured for temperature dependence of dielectric constant $\in$ at temperatures from 40 to 400° C., to obtain the Curie temperature Tc. Also, a TF analyzer was used to measure the hysteresis of each sample under the conditions of 25° C., 1 Hz, and 3 kV/mm, to calculate the coercive electric field. Next, voltage of 1.5 kV/mm was applied to this sample with external electrodes for 15 minutes at 150° C., to polarize the sample. Next, the piezoelectric constant Kr of this polarized sample was measured, the result of which is shown in Table 2. The piezoelectric constant Kr was calculated by measuring the impedance according to the applicable standard of the Japan Electronics and Information Technology Industries Association (JEITA EM-4501). The result is shown in Table 2.

TABLE 2

| | Sintering temperature (° C.) | Curie temperature Tc (° C.) | Dielectric constant $\in$ | Coercive electric field (kV/mm) | Piezoelectric constant Kr (%) | Other |
|---|---|---|---|---|---|---|
| Sample 1A | 900 | 310 | 2000 | 1.2 | 70 | Ag is segregated in the voids present in the sintered compact of the perovskite composition. |
| Sample 1B | 900 | 310 | 2010 | 1.2 | 71 | Same as above. |
| Sample 2 | 900 | 230 | 3460 | 0.93 | 65 | Ag is dispersed almost uniformly in the sintered compact of the perovskite composition. |
| Sample 3 | 1050 | 310 | 2100 | 1.2 | 70 | Could not be sintered at 900° C. |
| Sample 4 | 900 | 310 | 2200 | 1.2 | 55 | Ag is segregated in the voids present in the sintered compact of the perovskite composition, but a secondary Ag phase is formed in the surface layer. |
| Sample 5 | 900 | — | — | — | — | Measurement was not possible due to depositing of a secondary Pb phase. |
| Sample 6 | 1000 | 305 | 2340 | 1.2 | 58 | Could not be sintered at 900° C. |
| Sample 7 | 900 | 280 | 2900 | 0.98 | 64 | The Tc dropped and the coercive electric field decreased. |
| Sample 8 | 900 | 315 | 1950 | 1.2 | 57 | The piezoelectric constant dropped. |
| Sample 9 | 900 | 317 | 1920 | 1.3 | 55 | The piezoelectric constant dropped. |
| Sample 10 | 900 | 283 | 2500 | 0.97 | 64 | The Tc dropped and the coercive electric field decreased. |
| Sample 11 | 900 | 317 | 2100 | 1.2 | 53 | The piezoelectric constant dropped. |
| Sample 12 | 900 | 310 | 2100 | 1.2 | 54 | The piezoelectric constant dropped. |
| Sample 13 | 900 | 319 | 2030 | 1.2 | 56 | The piezoelectric constant dropped. |

Additionally, the piezoelectric ceramic compositions of Samples 1A, 1B and 2 were used to form green sheets using the doctor blade method, and the obtained green sheets were printed with an Ag paste using the screen printing method, to form unsintered internal conductor layers.

Next, 11 green sheets on which unsintered internal conductor layers were formed were stacked on top of one another, after which cover sheets, each produced by stacking to a specified thickness a number of identical sheets with no paste printed on them, were placed at the top and bottom to sandwich the green sheets, and then all sheets were pressure-bonded to manufacture an unsintered laminate.

Next, this unsintered laminate was put in an electric furnace and sintered for 2 hours at 900° C. in atmosphere, to manufacture a laminate. A TEM image of the obtained laminate was taken to check if Ag was segregated in the voids present in the sintered compact of the perovskite composition. In addition, EDS (energy-dispersive X-ray spectroscopy) was used to check whether oxygen was detected or not.

The piezoelectric device of Sample 1 had Ag segregated in the voids present in the sintered compact of the perovskite composition. The grain size of this segregated Ag was 2.1 μm in d80 diameter. Moreover, EDS did not detect oxygen in the segregated Ag, and the segregated Ag was metal Ag, not an oxide. Then, as shown in Table 1, this piezoelectric device had a high Curie temperature Tc and high coercive electric field, could be driven at high temperatures of 105° C. and above, and was suitable for use at high temperatures. In addition, its dielectric constant ∈ was low and power consumption was low. Furthermore, the piezoelectric ceramic composition could be sintered at 900° C. or below.

Similar results were also obtained from Sample 1B whose Re was Nd. Samples 1A and 1B are considered piezoelectric ceramic compositions conforming to the present invention.

On the other hand, the piezoelectric device of Sample 2 had Ag dispersed almost uniformly relative to the piezoelectric ceramic layer and segregation of Ag could not be confirmed in the voids. In addition, its low Curie temperature Tc and low coercive electric field made this piezoelectric device unsuitable for use at high temperatures of 105° C. and above. Furthermore, the piezoelectric device also had a high dielectric constant ∈ and high power consumption.

Additionally, the piezoelectric device of Sample 3 that used a piezoelectric ceramic composition containing no Ag component required a sintering temperature of 1100° C. or above, and could not be sintered simultaneously with Ag or any Ag alloy with high Ag content. Also, the need for high sintering temperature required more sintering energy and added to the manufacturing cost.

Additionally, Sample 4 that used a piezoelectric ceramic composition containing more Ag component than the preferable range specified under the present invention had Ag deposited on the surface of the piezoelectric ceramic layer, which made the product prone to shorter longevity traits.

Additionally, Sample 5 whose Pb was adjusted to a>1.05 could not be evaluated for characteristics due to depositing of a secondary Pb phase.

Additionally, Sample 6 whose Pb was adjusted to a<0.95 could not be sintered at low temperature.

Additionally, Sample 7 whose Re was adjusted to x>0.05 exhibited a lower Tc and low coercive electric field.

Additionally, Sample 8 whose Zr was adjusted to b>0.45 exhibited a lower piezoelectric constant.

Additionally, Sample 9 whose Ti was adjusted to c>0.45 exhibited a lower piezoelectric constant.

Additionally, Sample 10 whose $(Ni_{1/3}Nb_{2/3})$ was adjusted to d>0.10 exhibited a lower Tc and low coercive electric field.

Additionally, Sample 11 whose $(Ni_{1/3}Nb_{2/3})$ was adjusted to d=0 exhibited a lower piezoelectric constant.

Additionally, Sample 12 whose $(Zn_{1/3}Nb_{2/3})$ was adjusted to e>0.20 exhibited a lower piezoelectric constant.

Additionally, Sample 13 whose $(Zn_{1/3}Nb_{2/3})$ was adjusted to e<0.07 exhibited a lower piezoelectric constant.

What is claimed is:

1. A piezoelectric device having a piezoelectric ceramic layer obtained by sintering a piezoelectric ceramic composition that contains a perovskite composition and Ag component, as well as a conductor layer sandwiching the piezoelectric ceramic layer, wherein the piezoelectric ceramic layer has Ag segregated in voids present in a sintered compact of the perovskite composition, wherein the perovskite composition contains a zirconate-titanate type perovskite composition expressed by Formula (1) below, as well as an Ag component, and the Ag component is contained by 0.05 to 0.3 parts by mass per 100 parts by mass of the zirconate-titanate type perovskite composition in terms of oxides:

$$(Pb_a \cdot Re_x)\{Zr_b \cdot Ti_c \cdot (Ni_{1/3}Nb_{2/3})_d \cdot (Zn_{1/3}Nb_{2/3})_e\}O_3 \quad (1)$$

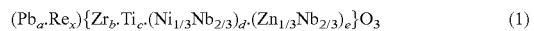

wherein Re represents at least one of La and Nd, and a to e and x meet the respective requirements below:

$$0.95 \leq a \leq 1.05$$

$$0 \leq x \leq 0.05$$

$$0.35 \leq b \leq 0.45$$

$$0.35 \leq c \leq 0.45$$

$$0 < d \leq 0.10$$

$$0.07 \leq e \leq 0.20$$

$$b+c+d+e=1.$$

2. A piezoelectric device according to claim 1, wherein the perovskite composition contains the zirconate-titanate type perovskite composition and an alkali-containing niobate type perovskite composition.

3. A piezoelectric device according to claim 1, wherein a grain size of the Ag segregated in the voids present in the sintered compact of the perovskite composition is 0.1 to 3 μm in d80 which is the 80th percentile diameter of the Ag grains.

4. A piezoelectric device according to claim 1, wherein the conductor layer is formed by Ag, Pd, Pt, Ni, Cu, or any alloy containing at least one of the foregoing.

5. A piezoelectric device according to claim 2, wherein a grain size of the Ag segregated in the voids present in the sintered compact of the perovskite composition is 0.1 to 3 μm in d80 diameter which is the 80th percentile diameter of the Ag grains.

6. A piezoelectric device according to claim 2, wherein the conductor layer is formed by Ag, Pd, Pt, Ni, Cu, or any alloy containing at least one of the foregoing.

7. A piezoelectric device according to claim 3, wherein the conductor layer is formed by Ag, Pd, Pt, Ni, Cu, or any alloy containing at least one of the foregoing.

8. A piezoelectric device according to claim 1, wherein the conductor layer is formed by Ag, Pd, Pt, Ni, Cu, or any alloy containing at least one of the foregoing.

* * * * *